(12) United States Patent
Liu et al.

(10) Patent No.: US 11,398,174 B2
(45) Date of Patent: Jul. 26, 2022

(54) ELECTROMAGNETIC INTERFERENCE SUPPRESSION CIRCUIT, METHOD FOR DRIVING SAME, AND ELECTRONIC APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xiaoshi Liu, Beijing (CN); Jianjun Wang, Beijing (CN); Zejun Chen, Beijing (CN); Rui Wang, Beijing (CN)

(73) Assignees: BOE Technology Group Co., LTD, Beijing (CN); Hefei Xinsheng Optoelectronics Technology Co., LTD, Anhui (CN)

( * ) Notice: Subject to any disclaimer, the term of this patent is extended or adjusted under 35 U.S.C. 154(b) by 39 days.

(21) Appl. No.: 16/999,119

(22) Filed: Aug. 21, 2020

(65) Prior Publication Data
US 2021/0158739 A1    May 27, 2021

(30) Foreign Application Priority Data
Nov. 25, 2019    (CN) .......................... 201911164314.4

(51) Int. Cl.
| H03K 5/00 | (2006.01) |
| G09G 3/20 | (2006.01) |
| H02M 1/44 | (2007.01) |
| H03K 5/1252 | (2006.01) |
| H03K 19/20 | (2006.01) |
| H03K 19/21 | (2006.01) |

(52) U.S. Cl.
CPC ................ G09G 3/20 (2013.01); H02M 1/44 (2013.01); H03K 5/1252 (2013.01); *G09G 2330/025* (2013.01); *G09G 2330/06* (2013.01); *H03K 19/20* (2013.01); *H03K 19/21* (2013.01)

(58) Field of Classification Search
None
See application file for complete search history.

(56) References Cited

U.S. PATENT DOCUMENTS

| 11,005,364 | B1* | 5/2021 | Radic ................ H02M 3/33515 |
| 2015/0349639 | A1* | 12/2015 | Hosoyama ............ H02M 3/156 323/271 |
| 2017/0222636 | A1* | 8/2017 | Zhang ..................... H02M 1/44 |
| 2020/0302890 | A1* | 9/2020 | Wang ..................... H02M 3/156 |
| 2021/0257906 | A1* | 8/2021 | Radic ................ H02M 7/2176 |
| 2021/0313876 | A1* | 10/2021 | Kumar ............. H02M 3/33561 |

* cited by examiner

*Primary Examiner* — Tuan T Lam
(74) *Attorney, Agent, or Firm* — Fay Sharpe LLP (57) ABSTRACT

An electromagnetic interference suppression circuit, a driving method thereof, and an electronic apparatus are provided. In the electromagnetic interference suppression circuit, a signal generating sub-circuit may generate a plurality of parallel target sequence signals, each with a period greater than a period threshold and a quantity of target sequence signals greater than a quantity threshold; and a frequency generating sub-circuit may output a frequency-jittered drive signal, for driving a switch mode power supply to operate, to the switch mode power supply under the control of the plurality of parallel target sequence signals.

20 Claims, 6 Drawing Sheets

ELECTROMAGNETIC INTERFERENCE SUPPRESSION CIRCUIT, METHOD FOR DRIVING SAME, AND ELECTRONIC APPARATUS

CROSS-REFERENCE TO RELATED APPLICATION

The present disclosure claims priority to Chinese Patent Application No. 201911164314.4, filed with the China Intellectual Property Administration on Nov. 25, 2019 and entitled "ELECTROMAGNETIC INTERFERENCE SUPPRESSION CIRCUIT, METHOD FOR DRIVING SAME, AND ELECTRONIC APPARATUS", the entire contents of which are incorporated herein by reference.

TECHNICAL FIELD

The present disclosure relates to the field of display technologies, and in particular to an electromagnetic interference suppression circuit, a method for driving the same, and an electronic apparatus.

BACKGROUND

With the development of the display technologies, switch mode power supplies have been widely applied to a variety of electronic apparatuses due to their advantages such as small size, low power consumption, and high efficiency. However, due to the high operating frequency of the switch mode power supply, and the influence of factors such as high voltage change rates and high current change rates at the instants of turn-on and turn-off, the switch mode power supplies are prone to electromagnetic interference (EMI).

At present, filtering components, such as common mode inductors and capacitors, and the like may be used for filtering the EMI generated by the switch mode power supplies to achieve the effect of reducing the EMI.

SUMMARY

Embodiments of the present disclosure provide an electromagnetic interference suppression circuit, a method for driving the same, and an electronic apparatus. The present disclosure employs the following technical solutions:

In an aspect, an electromagnetic interference suppression circuit is provided. The electromagnetic interference suppression circuit includes: a signal generating sub-circuit and a frequency generating sub-circuit; wherein the signal generating sub-circuit is connected to a signal source, a clock signal terminal and the frequency generating sub-circuit respectively, and is configured to output a plurality of parallel target sequence signals to the frequency sub-circuit in response to an initial signal provided by the signal source and a clock signal provided by the clock signal terminal, wherein each target sequence signal has a period greater than a period threshold, and a quantity of target sequence signals is greater than a quantity threshold; and the frequency generating sub-circuit is further connected to a first power supply terminal and a switch mode power supply respectively; the frequency generating sub-circuit is further connected to a switch mode power supply, and is configured to output a frequency-jittered drive signal to the switch mode power supply in response to the plurality of parallel target sequence signals and a first power supply signal provided by the first power supply terminal, wherein the drive signal is intended to drive the switch mode power supply to operate.

Optionally, the signal generating sub-circuit includes: a first sequence generator and a decoder; wherein the decoder includes a plurality of input terminals and a plurality of output terminals, wherein a quantity of input terminals of the decoder is less than the quantity threshold, and a quantity of output terminals of the decoder is greater than the quantity threshold;

the first sequence generator is connected to the signal source, the clock signal terminal and the plurality of input terminals of the decoder respectively, and is configured to output a plurality of parallel initial sequence signals to the decoder by the plurality of input terminals of the decoder in response to the initial signal and the clock signal, each initial sequence signal having a period greater than the period threshold; and the plurality of output terminals of the decoder are connected to the frequency generating sub-circuit, and the decoder is configured to output the plurality of parallel target sequence signals to the frequency generating sub-circuit in response to the plurality of parallel initial sequence signals.

Optionally, the first sequence generator includes: a plurality of D flip-flops and a logic gate unit;

the plurality of D flip-flops have clock signal interfaces that are all connected to the clock signal terminal, and an input terminal of a first D flip-flop of the D flip-flops is connected to the signal source and an output terminal of the logic gate unit, an output terminal of each of the D flip-flops except the first D flip-flop is connected to an output terminal of a previous D flip-flop thereof, and the output terminal of each of the D flip-flops is connected to an input terminal of the logic gate unit; and the output terminal of the logic gate unit is further connected to the plurality of input terminals of the decoder, and the logic gate unit is configured to generate the plurality of parallel initial sequence signals based on signals output by the output terminals of the plurality of D flip-flops.

Optionally, the first sequence generator includes: ten D flip-flops; the logic gate unit includes: seven NOR gates, four NAND gates, one AND gate, one XOR gate and one OR gate;

an output terminal of the first D flip-flop and an output terminal of the second D flip-flop are connected to an input terminal of the first NOR gate, and output terminals of the third D flip-flop to a sixth D flip-flop of the D flip-flops are connected to an input terminal of the second NOR gate, output terminals of a seventh D flip-flop to a tenth D flip-flop of the D flip-flops are connected to an input terminal of the third NOR gate, and the output terminal of the seventh D flip-flop and the output terminal of the tenth D flip-flop are connected to an input terminal of the XOR gate;

an output terminal of a first NOR gate, an output terminal of a second NOR gate and an output terminal of a third NOR gate are all connected to an input terminal of the AND gate, an output terminal of the AND gate or an output terminal of the XOR gate is connected to an input terminal of the OR gate, and an output terminal of the OR gate is connected to the input terminal of the first D flip-flop;

the output terminal of the first D flip-flop is further connected to an input terminal of a fourth NOR gate, the output terminal of a second D flip-flop of the D flip-flops is further connected to an input terminal of a fifth NOR gate, the output terminal of a third D flip-flop of the D flip-flops is further connected to an input terminal of a sixth NOR gate, the output terminal of a fourth D flip-flop of the D flip-flops is further connected to an input terminal of a seventh NOR gate, and the input terminals of the fourth NOR gate to the seventh NOR gate are also connected to the initial signal terminal; and An input terminal of a first NOT gate is connected to the input terminal of the fourth NOR gate and the input terminal of the decoder, an input terminal of a second NOT gate is connected to the input terminal of the fifth NOR gate and the input terminal of the decoder, an input terminal of a third NOT gate is connected to the input terminal of the sixth NOR gate and the input terminal of the decoder, and an input terminal of a fourth NOT gate is connected to the input terminal of the seventh NOR gate and the input terminal of the decoder.

Optionally, the signal generating sub-circuit includes: a second sequence generator including an input terminal and a plurality of output terminals, a quantity of output terminals of the second sequence generator being greater than the quantity threshold; and the input terminal of the second sequence generator is connected to the signal source and the clock signal terminal respectively, the plurality of output terminals of the second sequence generator are connected to the frequency generating sub-circuit, and the second sequence generator is configured to generate the plurality of parallel sequence signals in response to the initial signal and the clock signal, and to output the plurality of parallel target sequence signals to the frequency generating sub-circuit by the plurality of output terminals of the second sequence generator.

Optionally, the frequency generating sub-circuit includes: a current providing unit and a frequency generating unit; wherein the current providing unit is connected to the first power supply terminal, the signal generating sub-circuit and the frequency generating unit respectively, and is configured to output a drive current to the frequency generating unit in response to the plurality of parallel target sequence signals and the first power supply signal; and the frequency generating unit is further connected to the switch mode power supply, and is configured to generate the frequency-jittered driving signal under the driving of the drive current and output the frequency-jittered drive signal to the switch mode power supply.

Optionally, the current providing unit is further connected to a reference power supply terminal, and is configured to output the drive current to the frequency generating unit based on the reference power supply signal provided by the reference power supply terminal and a partial voltage of the current providing unit.

Optionally, the current providing unit includes: a plurality of first switch transistors, a plurality of first resistors connected in series, and a current mirror unit; wherein one terminals of the plurality of first resistors connected in series are connected to a second power supply terminal, the other terminals of the plurality of first resistors connected in series are connected to the current mirror unit, and the current mirror unit is further connected to the first power supply terminal, the reference power supply terminal, and the frequency generating unit respectively;

a gate of each of the first switch transistors is connected to one output terminal of the signal generating sub-circuit, and the gates of the first switch transistors are connected to different output terminals;

first electrodes of the plurality of first switch transistors are all connected to the second power supply terminal; and a second electrode of each of the first switch transistors is connected between two adjacent first resistors, and the second electrode of only one of the first switch transistors is connected between each two adjacent first resistors.

Optionally, the current mirror unit includes: a first transistor, a second transistor, a third transistor, and a comparator; wherein a first input terminal of the comparator is connected to the reference power supply terminal, a second input terminal of the comparator is connected to the other terminal of the plurality of first resistors connected in series, and an output terminal of the comparator is connected to a gate of the first transistor;

a first electrode of the first transistor is connected to the other terminal of the plurality of first resistors connected in series, and a second electrode of the first transistor is connected to a first electrode of the second transistor; and a gate of the second transistor is connected to a gate of the third transistor, a second electrode of the second transistor and a first electrode of the third transistor are connected to the first power supply terminal, and a second electrode of the third transistor is connected to the frequency generating unit.

Optionally, the current providing unit includes: a plurality of second switch transistors and a plurality of second resistors connected in series; wherein one terminals of the plurality of second resistors connected in series are connected to a second power source terminal, and the other terminals of the plurality of second resistors connected in series are connected to the first power supply terminal and the frequency generating unit;

a gate of each of the second switch transistors is connected to one output terminal of the signal generating sub-circuit, and the gates of the second switch transistors are connected to different output terminals;

first electrodes of the plurality of second switch transistors are all connected to the second power supply terminal; and a second electrode of each of the second switch transistors is connected between two adjacent second resistors, and the second electrode of only one of the second switch transistors is connected between each two adjacent second resistors.

Optionally, the frequency generating unit is an oscillator.

In another aspect, a method for driving an electromagnetic interference suppression circuit is provided. The electromagnetic interference suppression circuit includes: a signal generating sub-circuit and a frequency generating sub-circuit; wherein the signal generating sub-circuit is connected to a signal source, a clock signal terminal and the frequency generating sub-circuit respectively, the frequency generating sub-circuit is further connected to the first power supply terminal, and is further configured to connect a switch mode power supply.

The method includes:

providing an initial signal for the signal source, providing a clock signal for the clock signal terminal, and outputting a plurality of parallel target sequence signals to the frequency generating sub-circuit by the signal generating sub-circuit in response to the initial signal and the clock signal, wherein each of the target sequence signals has a period greater than a period threshold, and a quantity of parallel target sequence signals is greater than a quantity threshold; and providing a first power supply signal for the first power supply terminal, and outputting a frequency-jittered drive signal to the switch mode power supply by the frequency generating sub-circuit in response to the plurality of parallel target sequence signals and the first power supply signal, wherein the drive signal is intended to drive the switch mode power supply to operate.

Optionally, the signal generating sub-circuit includes: a first sequence generator and a decoder, the decoder has a plurality of input terminals and a plurality of output terminals, a quantity of input terminals of the decoder is less than the quantity threshold, and a quantity of output terminals of the decoder is greater than the quantity threshold; and outputting the plurality of parallel target sequence signals to the frequency generating sub-circuit by the signal generating sub-circuit in response to the initial signal and the clock signal includes:

outputting a plurality of parallel initial sequence signals to the decoder by the plurality of input terminals of the decoder by the first sequence generator in response to the initial signal and the clock signal, wherein each initial sequence signal has a period greater than the period threshold; and outputting the plurality of parallel target sequence signals to the frequency generating sub-circuit by the decoder in response to the plurality of parallel initial sequence signals.

Optionally, the signal generating sub-circuit includes: a second sequence generator, the second sequence generator has an input terminal and a plurality of output terminals, and a quantity of output terminals of the second sequence generator is greater than the quantity threshold; outputting the plurality of parallel target sequence signals to the frequency generating sub-circuit by the signal generating sub-circuit in response to the initial signal and the clock signal includes:

generating a plurality of parallel target sequence signals in response to the initial signal and the clock signal and outputting the plurality of parallel target sequence signals to the frequency generating sub-circuit by the plurality of output terminals of the second sequence generator, by the second sequence generator.

Optionally, the frequency generating sub-circuit includes: a current providing unit and a frequency generating unit; and outputting the frequency-jittered drive signal to the switch mode power supply by the frequency generating sub-circuit in response to the plurality of parallel target sequence signals and the first power supply signal includes:

outputting a drive current to the frequency generating unit by the current providing unit in response to the plurality of parallel target sequence signals and the first power supply signal; and generating a frequency-jittered drive signal under the driving of the drive current and outputting the drive signal to the switch mode power supply, by the frequency generating unit.

Optionally, the current providing unit is further connected to a reference power supply terminal; and outputting the drive current to the frequency generating unit by the current providing unit in response to the plurality of parallel target sequence signals and the first power supply signal includes:

outputting the drive current to the frequency generating unit by the current providing unit in response to the multiple parallel target sequence signals, the first power supply signal, a reference power supply signal provided by the reference power supply terminal, and a partial voltage of the current providing unit.

In a further aspect, an electronic apparatus is provided. The electronic apparatus includes: a switch mode power supply, and an electromagnetic interference suppression circuit, wherein the electromagnetic interference suppression circuit includes: a signal generating sub-circuit and a frequency generating sub-circuit;

the signal generating sub-circuit is connected to a signal source, a clock signal terminal and the frequency generating sub-circuit respectively, and is configured to output a plurality of parallel target sequence signals to the frequency sub-circuit in response to an initial signal provided by the signal source and a clock signal provided by the clock signal terminal, wherein each target sequence signal has a period greater than a period threshold, and a quantity of target sequence signals is greater than a quantity threshold;

the frequency generating sub-circuit is further connected to a first power supply terminal and the switch mode power supply respectively, and is configured to output a frequency-jittered drive signal to the switch mode power supply in response to the plurality of parallel target sequence signals and a first power supply signal provided by the first power supply terminal; and the switch mode power supply operates under the control of the drive signal.

Optionally, the electronic apparatus includes a display device.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

The embodiments of the present disclosure will be described in further detail with reference to the attached drawings, to more clearly present the objects, technical solutions, and advantages of the present disclosure.

The transistors used in all the embodiments of the present disclosure may be thin-film transistors or field effect transistors or other devices with the same characteristics. According to the function in a circuit, the transistors used in the embodiments of the present disclosure are mainly switch transistors. The source and drain of the switch transistor used herein are symmetrical and thus are interchangeable. In the embodiments of the present disclosure, the source is called as a first electrode and the drain is called as a second electrode; or, the drain therein is called as the first electrode and the source is called as the second electrode. According to the form in the drawings, it is specified that a middle terminal of the transistor is a gate, a signal input terminal is the source, and a signal output terminal is the drain. Furthermore, the switch transistors used in the embodiments of the present disclosure may comprise any one of a P-type switch transistor and an N-type switch transistor, wherein the P-type switch transistor is turned on when the gate is at a low level, and turned off when the gale is at a high level; and the N-type switch transistor is turned on when the gate is at a high level, and is turned off when the gate is at a low level. Furthermore, a plurality of signals in the embodiments of the present disclosure all correspond to a first potential and a second potential; and the first potential and the second potential only represent that the potential of the signal has two different state quantities, rather than representing the first potential or the second potential having a specific value in the full text.

As a high-frequency electrical energy conversion device, the switch mode power supply is widely used in various electronic apparatuses. With the continuous development of science and technology, the requirements for the operating frequency of the switch mode power supply have become higher and higher; and the operating frequency of the switch mode power supply is developed from several kilohertzs to several megahertzs and then to several hundreds of megahertzs. However, because of the high operating frequency of the switch mode power supply, the voltage change rate and current change rate of the switch mode power supply become higher at the instants when a power switching tube inside the switch mode power supply is turned on or off, leading to large surge voltage and current easily occurring to the switch mode power supply. Under the influence of the large surge voltage and current, the switch mode power supply is prone to EMI.

For example, the EMI generated by the direct current-direct current (DC-DC) switch mode power supply in a liquid crystal display (LCD) is the main source of EMI from the LCD.

It is of particular importance to suppress the EMI generated by the switch mode power supply in the design of the switch mode power supply, since the EMI generated by the switch mode power supply in an electronic apparatus may interfere with the normal operation of other electronic apparatuses around the electronic apparatus, and cause a decrease in the performance of other electronic apparatuses. For example, for a vehicle-mounted electronic apparatus (i.e., an electronic apparatus configured in a vehicle to enrich automotive functions), the life safety of users driving or taking the vehicle may be affected if the EMI generated by the switch mode power supply in the vehicle-mounted electronic apparatus cannot be effectively suppressed.

In related technologies, common mode inductors and capacitors and other active devices may be used for filtering the EMI, so as to achieve the effect of reducing the EMI. However, the method for suppressing the EMI in this way is restricted by factors such as large size and high cost of the common mode inductors and capacitors, which goes against the mass production. Or, the EMI may be suppressed using a transformer, which, however, shows high winding difficulty and high insulation difficulty, resulting in poor reliability in EMI suppression. Or, the EMI may also be suppressed by designing a printed circuit board (PCB) that suppresses the EMI. However, the design of the PCB requires rich experience and the PCB is extremely difficult to design and manufacture, resulting in poor flexibility in EMI suppression.

The embodiments of the present disclosure provide an electromagnetic interference suppression circuit, which effectively and reliably suppresses the EMI generated by the switch mode power supply based on the frequency jitter technology on the premise of reduced size and cost, without bringing other negative effects to the operating frequency of the switch mode power or any inconvenience to the manufacture of the switch mode power supply. The frequency jittering technology is intended to broaden the frequency band of each subharmonic with the total spectrum energy keeping unchanged, so as to reduce the peak energy of each subharmonic, thereby reducing the EMI.

Figure 1:
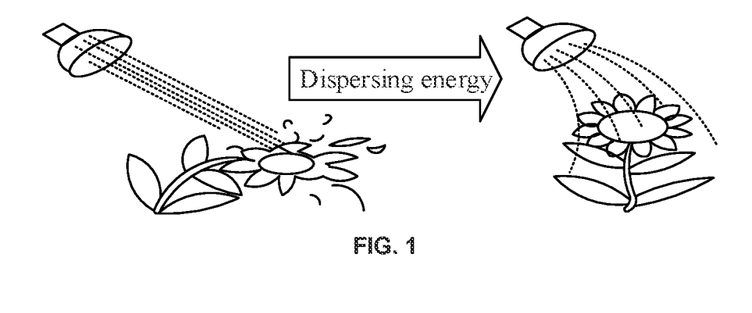
FIG. 1 is a schematic diagram showing a principle of suppressing EMI based on a frequency uttering technology according to an embodiment of the present disclosure.

FIG. 1 is a schematic diagram showing a principle of suppressing EMI based on a frequency jittering technology according to an embodiment of the present disclosure. As shown in FIG. 1, water from a faucet which may be called as total spectrum energy is sprayed to a flower from a small hole at a fixed frequency, and the water from the faucet is subjected to energy dispersion and then sprayed to the flower from a plurality of small holes at different frequencies. In the two cases above, the pressures applied to the flower are different. With reference to FIG. 1, it can be seen by comparing the two cases that after the water from the faucet is dispersed and sprayed from the plurality of small holes, the overall force of spraying the water (equivalent to the EMI) will become much smaller, and the more and broader the water is dispersed, the better the effect of the energy dispersion. Therefore, the EMI generated by the switch mode power supply can be effectively reduced by adjusting the operating frequency of the switch mode power supply to allow the switch mode power supply to operate at a jittering frequency instead of a fixed frequency. Moreover, the larger the dispersion period, the lower the probability of the energy of the same frequency, and the larger the quantity of dispersion sites, the finer the effect of frequency jittering.

Figure 2:
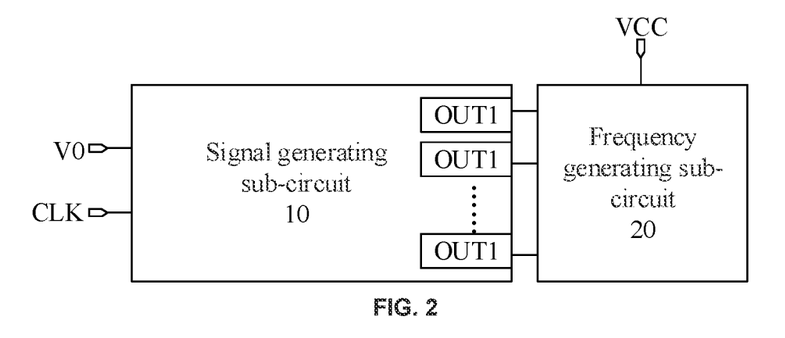
FIG. 2 is a schematic structural diagram of an electromagnetic interference suppression circuit according to an embodiment of the present disclosure.

FIG. 2 is a schematic structural diagram of an electromagnetic interference suppression circuit according to an embodiment of the present disclosure. As shown in FIG. 2, the electromagnetic interference suppression circuit includes: a signal generating sub-circuit 10 and a frequency generating sub-circuit 20.

The signal generating sub-circuit 10 may be connected to a signal source V0, a clock signal terminal CLK and a frequency generating sub-circuit 20 respectively. The signal generating sub-circuit 10 may be configured to output a plurality of parallel target sequence signals to a frequency generating sub-circuit 20 in response to an initial signal provided by the signal source V0 and a clock signal provided by the clock signal terminal CLK.

For example, referring to FIG. 2, the signal generating sub-circuit 10 may be connected to the frequency generating sub-circuit 20 by a plurality of output terminals OUT1. Accordingly, the signal generating sub-circuit 10 may output the plurality of parallel target sequence signals to the frequency generating sub-circuit 20 by the plurality of output terminals OUT1.

Each of the target sequence signal may have a period greater than a period threshold, and a quantity of parallel target sequence signal may be greater than a quantity threshold.

Optionally, the period threshold and the quantity threshold may be preset fixed values. For example, the period threshold and the quantity threshold may be values pre-configured in the sub-circuit by a user when the signal generating sub-circuit 10 is shipped from a factory.

The frequency generating sub-circuit 20 may also be connected to a first power supply terminal VCC, and the frequency generating sub-circuit 20 may be configured to connect a switch mode power supply (not shown in FIG. 2). The frequency generating sub-circuit 20 may be configured to output a frequency-jittered drive signal to the switch mode power supply in response to the plurality of parallel target sequence signals and the first power supply signal VCC; and the drive signal may be configured to drive the switch mode power supply to operate.

In summary, the embodiments of the present disclosure provide the electromagnetic interference suppression circuit. The electromagnetic interference suppression circuit includes the signal generating sub-circuit and the frequency generating sub-circuit. Since the signal generating sub-circuit may generate the plurality of parallel target sequence signals, each with a period greater than a period threshold and a quantity of target sequence signals greater than a quantity threshold, the frequency generating sub-circuit may output a frequency-jittered drive signal, for driving the switch mode power supply to operate, to the switch mode power supply under the control of the plurality of parallel target sequence signals. Therefore, the electromagnetic interference generated by the switch mode power supply is suppressed effectively and reliably based on the frequency uttering technology, with reduced cost.

Figure 3:
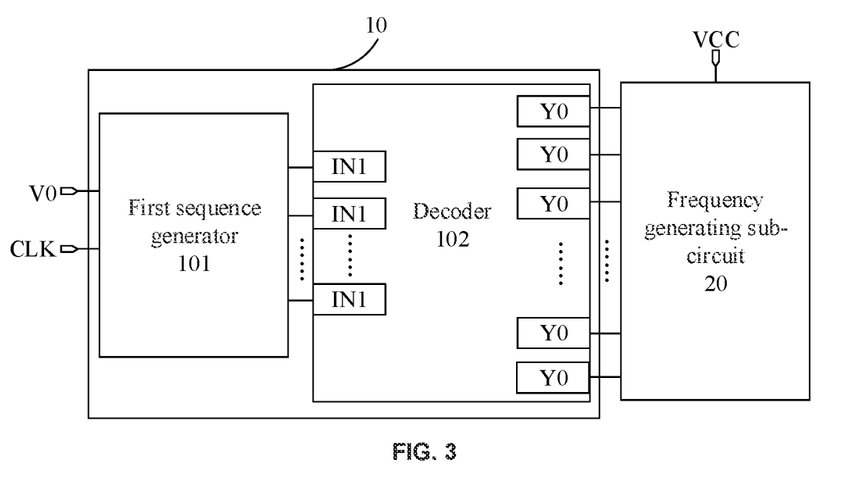
FIG. 3 is a schematic structural diagram of another electromagnetic interference suppression circuit according to an embodiment of the present disclosure.

As an alternative implementation, FIG. 3 is a schematic structural diagram of another electromagnetic interference suppression circuit according to an embodiment of the present disclosure. As shown in FIG. 3, the signal generating sub-circuit 10 may include: a first sequence generator 101 and a decoder 102. The decoder 102 may have a plurality of input terminals IN1 and a plurality of output terminals Y0. A quantity of input terminals IN1 of the decoder 102 may be less than the quantity threshold, and a quantity of output terminals Y0 of the decoder 102 may be greater than the quantity threshold.

Referring to FIG. 3, the first sequence generator 101 may be connected to the signal source V0, the clock signal terminal CLK, and the plurality of input terminals IN1 of the decoder 102 respectively. The first sequence generator 101 may output a plurality of parallel initial sequence signals to the decoder 102 by the plurality of input terminals IN1 of the decoder 102 in response to the initial signal provided by the signal source V0 and the clock signal provided by the clock signal terminal CLK. Each initial sequence signal may have a period greater than the period threshold.

The plurality of output terminals Y0 of the decoder 102 may be connected to the frequency generating sub-circuit 20. The decoder 102 may output the plurality of parallel target sequence signals to the frequency generating sub-circuit 20 in response to the plurality of parallel initial sequence signals. That is, the signal generating sub-circuit 10 may output the plurality of parallel target sequence signals to the frequency generating sub-circuit 20 via the decoder 102 included therein.

With reference to the description above, the quantity of the input terminals IN1 of the decoder 102 may be the same as the quantity of initial sequence signals, and the quantity of the output terminals Y0 of the decoder 102 may be the same as the quantity of target sequence signals. For example, assuming that the period threshold is 1020 and the quantity threshold is 10, the first sequence generator 101 generates four initial sequence signals, and the period of each initial sequence signal is 1024. Then, a decoder 102 (i.e., a 4-15 decoder 102) including four input terminals IN1 and 15 output terminals Y0 may be provided. The 4-15 decoder 102 may decode the four initial sequence signals into 15 parallel target sequence signals, each with a period greater than the period threshold and a quantity of signals greater than the quantity threshold, without changing the period of each signal.

Optionally, each sequence signal (including the initial sequence signals or the target sequence signals) may be expressed in the form of a binary value of 0 or 1. 0 may represent a valid potential, and correspondingly, 1 may represent an invalid potential. Similarly, 0 may represent an invalid potential, and correspondingly, 1 may represent a valid potential.

The first sequence generator 101 is configured to first generate the plurality of parallel initial sequence signals having a small quantity of initial sequence signals and a period greater than the period threshold, and then the decoder 102 is configured to generate the plurality of parallel target sequence signals having the same period and a quantity of signals greater than the quantity threshold (i.e. a large quantity of target sequence signals) based on the initial sequence signals. In this way, while the EMI is effectively suppressed, the principle that the decoder 102 does not change the period and only changes the quantity of signals can be fully used to precisely suppress the EMI. Moreover, the decoder belongs to the existing circuit structure, and thus is low in production cost and simple in circuit manufacturing, which is beneficial to mass production.

Figure 4:
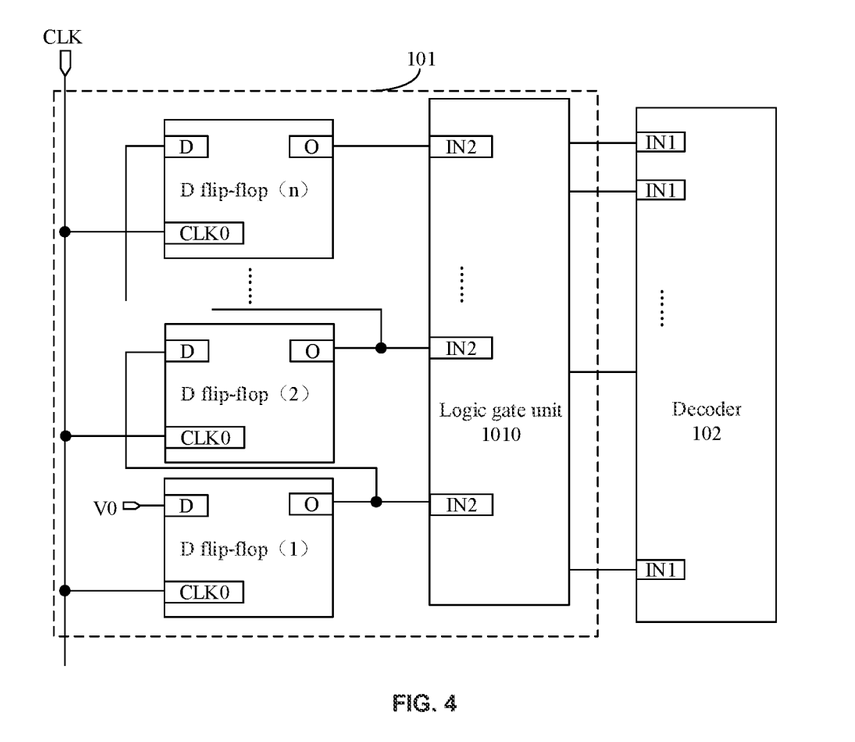
FIG. 4 is a schematic structural diagram of a signal generating sub-circuit according to an embodiment of the present disclosure.

FIG. 4 is a schematic structural diagram of a signal generating sub-circuit according to an embodiment of the present disclosure. As shown in FIG. 4, the first sequence generator 101 may include: a plurality of D flip-flops and a logic gate unit 1010. For example, FIG. 4 shows a total of n D flip-flops: a D flip-flop (1) to a D flip-flop (n).

All the clock signal interfaces CLK0 of the plurality of D flip-flops may be connected to the same clock signal terminal CLK. An input terminal D of the first D flip-flop (i.e., the D flip-flop (1) shown in FIG. 4) may be connected to the signal source V0 and an output terminal of the logic gate unit 1010 (not shown in FIG. 4) respectively. The input terminals D of the D flip-flops except the first D flip-flop may be connected to the output terminal O of the previous D flip-flop, and the output terminal O of each D flip-flop may be connected to an input terminal IN2 of the logic gate unit 1010.

The output terminal of the logic gate unit 1010 may also be connected to the plurality of input terminals Y0 of the decoder 102. The logic gate unit 1010 may be configured to generate the plurality of parallel initial sequence signals based on signals output by the output terminals O of the plurality of D flip-flops.

Figure 5:
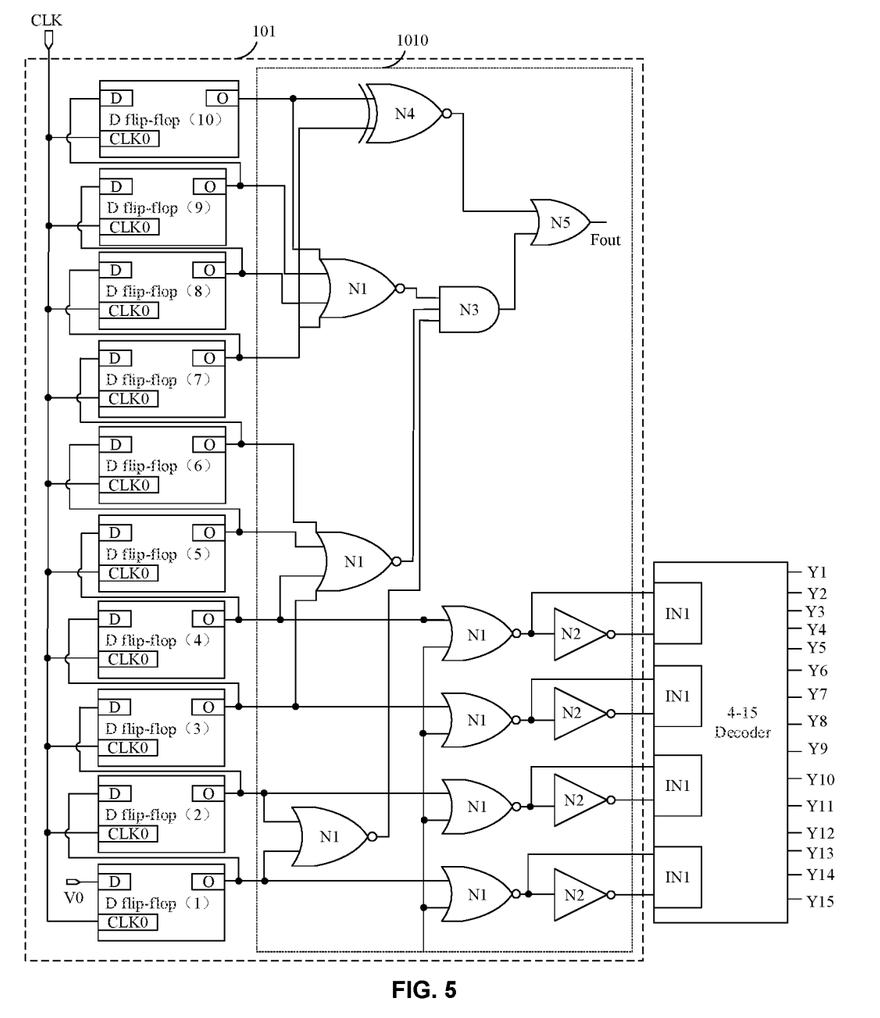
FIG. 5 is a schematic structural diagram of another signal generating sub-circuit according to an embodiment of the present disclosure.

FIG. 5 is a schematic structural diagram of another signal generating sub-circuit according to an embodiment of the present disclosure. As shown in FIG. 5, the first sequence generator 101 may include: ten D flip-flops.

Referring again to FIG. 5, the logic gate unit 1010 may include: seven NOR gates N1, four NOT gates N2, one AND gate N3, one XOR gate N4, and one OR gate N5.

An output terminal O of a first D flip-flop of the D flip-flops and an output terminal O of a second D flip-flop of D flip-flops may be connected to an input terminal of a first NOR gate N1; output terminals O of a third D flip-flop to a sixth D flip-flop of the D flip-flops may be connected to an input terminal of a second NOR gate N1; output terminals O of a seventh D flip-flop to a tenth D flip-flop of the D flip-flops may be connected to an input terminal of a third NOR gate N1; and the output terminal O of the seventh D flip-flop and the output terminal O of the tenth D flip-flop may be connected to an input terminal of the XOR gate N4.

An output terminal of a first NOR gate N1, an output terminal of a second NOR gate N1, and an output terminal of a third NOR gate N1 may all be connected to an input terminal of the AND gate N3; an output terminal of the AND gate N3 and an output terminal of the XOR gate N4 may be connected to an input terminal of the OR gate N5; and an output terminal of the OR gate N5 may be connected to the input terminal D of the first D flip-flop. Moreover, the input terminal D of the first D flip-flop may also be connected to the signal source V0.

The output terminal O of the first D flip-flop may also be connected to an input terminal of a fourth NOR gate N1; the output terminal O of the second D flip-flop may also be connected to an input terminal of a fifth NOR gate N1; the output terminal O of the third D flip-flop may also be connected to an input terminal of a sixth NOR gate N1; the output terminal O of the fourth D flip-flop may also be connected to an input terminal of a seventh NOR gate N1; and the input terminals of the fourth NOR gate to the seventh NOR gate N1 may also be connected to the initial signal terminal (not shown in FIG. 5).

An input terminal of a first NOT gate N2 and the input terminal of the fourth NOR gate N1 may be connected to one input terminal IN1 of the decoder 102; an input terminal of a second NOT gate N2 and the input terminal of the fifth NOR gate may be connected to another input terminal IN1 of the decoder 102; an input terminal of a third NOT gate N2 and the input terminal of the sixth NOR gate N1 may be connected to a further input terminal IN1 of the decoder; an input terminal of a fourth NOT gate N2 and the input terminal of the seventh NOR gate N1 may be connected to still another input terminal IN1 of the decoder 102. Correspondingly, referring to FIG. 5, the decoder 102 may include fourth input terminals IN1, and FIG. 5 is illustrated with the decoder having 15 output terminals Y1 to Y15, by way of example.

For the first sequence generator shown in FIG. 5, a signal Fout output from the output terminal of the AND gate N5 may satisfy the following formula:

$$F_{out}=(Q1+Q2)'(Q3+Q4+Q5+Q6)'(Q7+Q8+Q9+Q10)' +(Q10 \oplus Q7)' \quad \text{Formula (1)}.$$

(Q1+Q2)' refers to a value output by the D flip-flops (1) and (2) by the first NOR gate N1; (Q3+Q4+Q5+Q6)' refers to a value output by the D flip-flops (3) to (6) by the second NOR gate N1; (Q7+Q8+Q9+Q10)' refers to a value output by the D flip-flops (7) to (10) by the third NOR gate N1; and (Q10⊕Q7)' refers to a value output by the D flip-flops (7) and (10) by the XOR gate N4. (Q1+Q2)'(Q3+Q4+Q5+Q6) '(Q7+Q8+Q9+Q10)' refers to a value output via the AND gate N3 from the value output by the first NOR gate N1, the value output by the second NOR gate N1 and the value output by the third NOR gate N1. Fout refers to a value output via the AND gate N5 from the value output by the AND gate N3 and the value output by the XOR gate N4.

In an embodiment of the present disclosure, the Fout may be used as an input of the D flip-flop (1), and finally the first sequence generator 101 may generate the plurality of parallel initial sequence signals having a period of $2^{10}=1024$. Moreover, due to the use of the AND gate N3 (representing multiplication in algebraic operations), an output result is a nonlinear function. Further, it is ensured that the first sequence generator 101 may be self-started without falling into an infinite loop (i.e., an invalid state).

With reference to FIG. 5, assuming that the four parallel initial sequence signals output by the first sequence generator 101 are A, B, C, and D respectively, the signals output by the 15 output terminals Y1 to Y15 of the 4-15 decoder may satisfy the following formula.

$$[Y1 \ldots Y15] = [A\,B\,C\,D] \begin{bmatrix} 1 & 0 & 1 & 1 & 0 & 0 & 1 & 1 & 0 & 1 & 0 & 0 & 0 & 1 & 1 \\ 0 & 1 & 1 & 1 & 1 & 0 & 0 & 1 & 0 & 0 & 1 & 0 & 1 & 1 & 0 \\ 0 & 0 & 0 & 1 & 1 & 1 & 1 & 1 & 1 & 1 & 1 & 0 & 0 & 0 & 0 \\ 0 & 0 & 0 & 0 & 0 & 0 & 0 & 1 & 1 & 1 & 1 & 1 & 1 & 1 & 1 \end{bmatrix}. \quad \text{Formula (2)}$$

$$\begin{bmatrix} 1 & 0 & 1 & 1 & 0 & 0 & 1 & 1 & 0 & 1 & 0 & 0 & 0 & 1 & 1 \\ 0 & 1 & 1 & 1 & 1 & 0 & 0 & 1 & 0 & 0 & 1 & 0 & 1 & 1 & 0 \\ 0 & 0 & 0 & 1 & 1 & 1 & 1 & 1 & 1 & 1 & 1 & 0 & 0 & 0 & 0 \\ 0 & 0 & 0 & 0 & 0 & 0 & 0 & 1 & 1 & 1 & 1 & 1 & 1 & 1 & 1 \end{bmatrix}$$

represents a decoding algorithm of the decoder. With the 4-15 decoder, four parallel initial sequence signals may be decoded and converted into 15 parallel target sequence signals without changing the period of each initial sequence signal. That is, the period of each target sequence signal finally output by the decoder 101 is still 1024.

Figure 6:
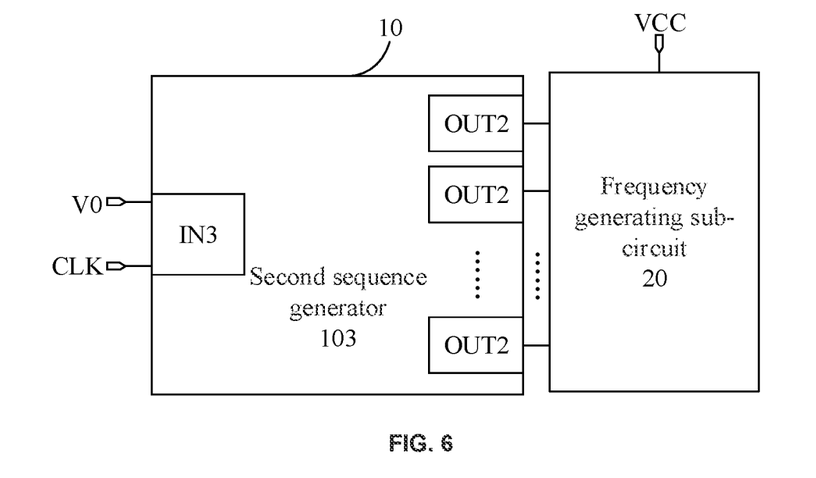
FIG. 6 is a schematic structural diagram of a further electromagnetic interference suppression circuit according to an embodiment of the present disclosure.

As another optional implementation, FIG. 6 is a schematic structural diagram of still another signal generating sub-circuit according to an embodiment of the present disclosure. As shown in FIG. 6, the signal generating sub-circuit 10 may include: a second sequence generator 103. The second sequence generator 103 may have an input terminal IN3 and a plurality of output terminals OUT2, wherein a quantity of output terminals OUT2 of the second sequence generator 103 may be greater than the quantity threshold.

The input terminal IN3 of the second sequence generator 103 may be connected to the signal source V0 and the clock signal terminal CLK respectively, and the plurality of output terminals OUT2 of the second sequence generator 103 may be directly connected to the frequency generating sub-circuit 20. The second sequence generator 103 may be configured to generate a plurality of parallel target sequence signals in response to the initial signal and the clock signal, and to output the plurality of parallel target sequence signals to the frequency generating sub-circuit 20 by the plurality of output terminals OUT2 of the second sequence generator.

Figure 7:
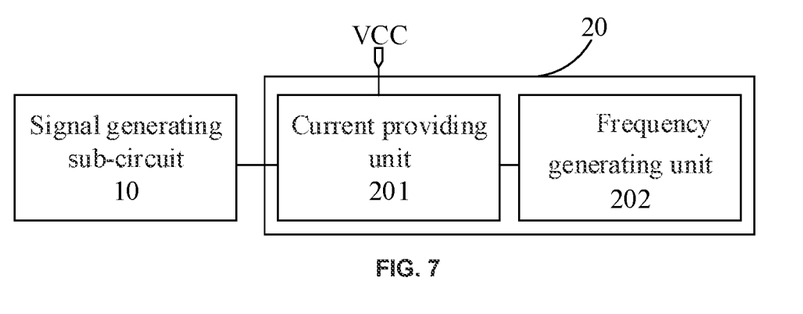
FIG. 7 is a schematic structural diagram of still another electromagnetic interference suppression circuit according to an embodiment of the present disclosure.

FIG. 7 is a schematic structural diagram of a further electromagnetic interference suppression circuit according to an embodiment of the present disclosure. As shown in FIG. 7, the frequency generating sub-circuit 20 may include: a current providing unit 201 and a frequency generating unit 202.

The current providing unit 201 may be connected to the first power supply terminal VCC, the signal generating sub-circuit 10 and the frequency generating unit 202 respectively. The current providing unit 201 may output a drive current to the frequency generating unit 202 in response to the plurality of parallel target sequence signals and the first power supply signal.

The frequency generating unit 202 may be configured to connect the switch mode power supply (not shown in FIG. 7). The frequency generating unit 202 may generate a drive signal under the driving of the drive current, and output the drive signal to the switch mode power supply, so as to drive the switch mode power supply to operate.

Figure 8:
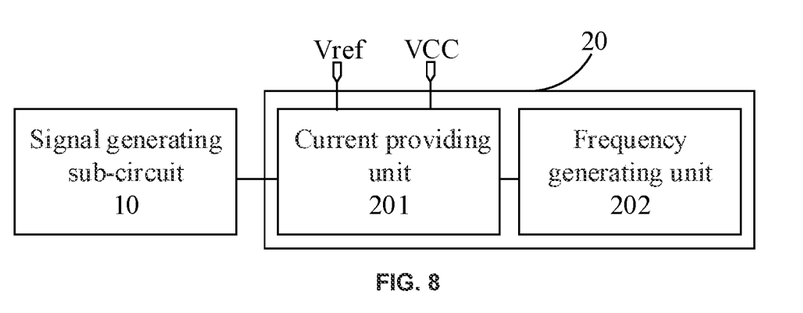
FIG. 8 is a schematic structural diagram of still another electromagnetic interference suppression circuit according to an embodiment of the present disclosure.

As an alternative implementation, FIG. 8 is a schematic structural diagram of a further electromagnetic interference suppression circuit according to an embodiment of the present disclosure. As shown in FIG. 8, the current providing unit 201 may also be connected to a reference power supply terminal Vref. The current providing unit 201 may output a drive current to the frequency generating unit 202 based on a reference power supply signal provided by the reference power supply terminal Vref and a partial voltage of the current providing unit 201.

The reference power supply signal may be a power supply signal that is predefined according to a frequency adjustment range of the frequency generating unit 202. The current providing unit 201 may stop outputting the drive current, i.e. stop operating, when the partial voltage is greater than the voltage of the reference power supply signal.

Figure 9:
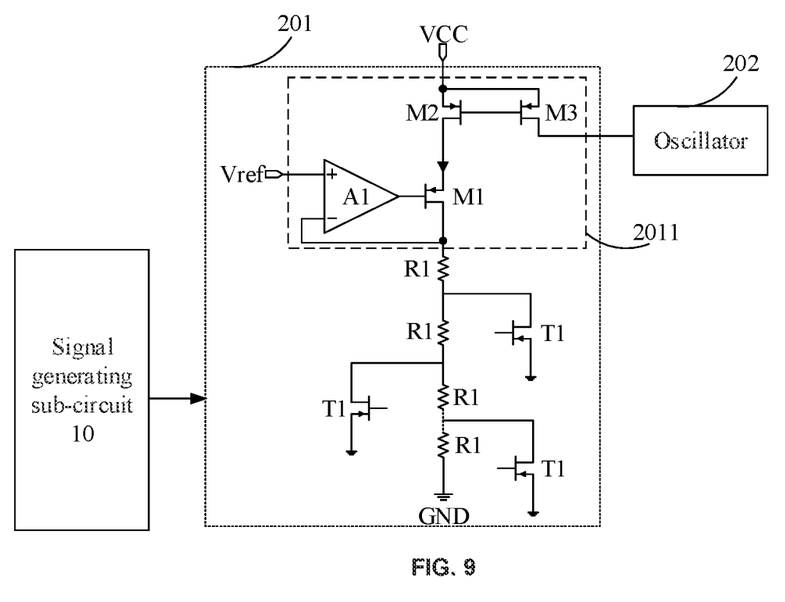
FIG. 9 is a schematic structural diagram of still another electromagnetic interference suppression circuit according to an embodiment of the present disclosure.

With the electromagnetic interference suppression circuit shown in FIG. 8 as an example, FIG. 9 shows a schematic structural diagram of still another electromagnetic interference suppression circuit according to an embodiment of the present disclosure. As shown in FIG. 9, the current providing unit 201 may include: a plurality of first switch transistors T1, a plurality of first resistors R1 connected in series, and a current mirror unit 2011.

Referring to FIG. 9, one terminals of the plurality of first resistors R1 connected in series may be connected to the second power supply terminal GND, and the other terminals of the plurality of first resistors R1 connected in series may be connected to the current mirror unit 2011. The current mirror unit 2011 may also be connected to the first power supply terminal VCC, the reference power supply terminal Vref, and the frequency generating unit 202 respectively.

A gate of each of the first switch transistors T1 may be connected to one output terminal of the signal generating sub-circuit 10, and the gates of the first switch transistors T1 are connected to different output terminals (not shown in FIG. 9). Correspondingly, each switch transistor T1 may be turned on or off in response to the potential of the target sequence signal that is input to a gate of the switch transistor T1 by the signal generating sub-circuit 10. The variation of a quantity of turned-on switch transistors T1 may lead to the variation of a quantity of connected first resistors R1, which in turn affects the magnitude of the drive current that is finally output to the frequency generating unit 202.

All the first electrodes of the plurality of first switch transistors T1 may be connected to the second power supply terminal GND.

A second electrode of each of the first switch transistors T1 may be connected between two adjacent first resistors R1, and the second electrode of only one of the first switch transistors T1 is connected between each two adjacent first resistors R1.

Still referring to FIG. 9, the current mirror unit 2011 may include: a first transistor M1, a second transistor M2, a third transistor M3, and a comparator A1.

A first input terminal (+) of the comparator A1 may be connected to the reference power supply terminal Vref; a second input terminal (−) of the comparator A1 may be connected to the other terminal of the plurality of first resistors R1 connected in series; and an output terminal of the comparator A1 may be connected to a gate of the first transistor M1.

A first electrode of the first transistor M1 may be connected to the other terminal of the plurality of first resistors R1 connected in series, and a second electrode of the first transistor M1 may be connected to a first electrode of the second transistor M2.

A gate of the second transistor M2 may be connected to a gate of the third transistor M3; a second electrode of the second transistor M2 and a first electrode of the third transistor M3 may be connected to the first power supply terminal VCC; and a second electrode of the third transistor M3 may be connected to the frequency generating unit 202.

As an example, with reference to FIG. 5 and FIG. 9, assuming that a total of 15 first switch transistors T1 are included, the gates of the 15 first switch transistors T1 may be connected to the 15 output terminals Y1 to Y15 of the decoder, respectively. The potentials of the target sequence signals output by the 15 output terminals Y1 to Y15 affect the quantity of turned-on and turned-off switch transistors T1 among the 15 first switch transistors T1. The quantity of turned-on and turned-off switch transistors T1 among the 15 first switch transistors T1 affects the quantity of connected first resistors R1, and accordingly, affects the magnitude of the drive current output to the frequency generating unit 202. The frequency generating unit 202 may output a frequency-jittered drive signal (i.e., the operating frequency) to the connected switch mode power supply based on the received drive current.

Optionally, processing components such as a frequency divider and an amplifier may be connected between the frequency generating unit 202 and the switch mode power supply, so as to improve the accuracy and reliability in the transmission of the drive signal.

Figure 10:
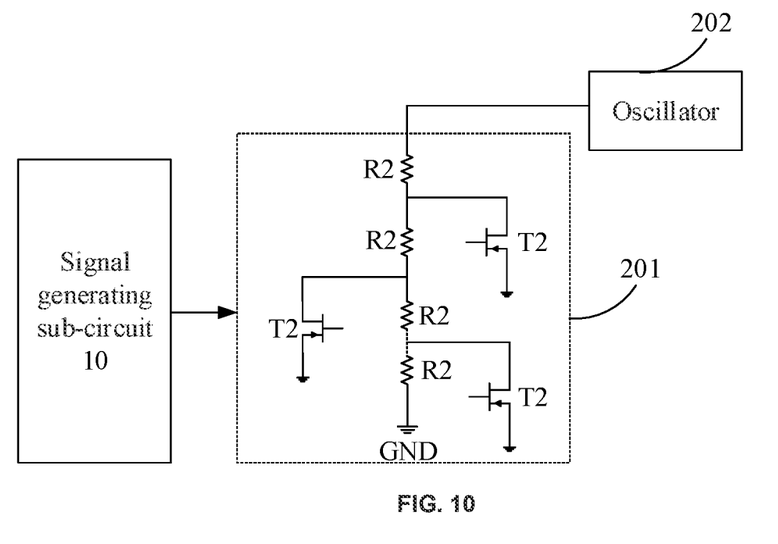
FIG. 10 is a schematic structural diagram of still another electromagnetic interference suppression circuit according to an embodiment of the present disclosure.

As another alternative implementation, FIG. 10 is a schematic structural diagram of a further electromagnetic interference suppression circuit according to an embodiment of the present disclosure. As shown in FIG. 10, the current providing unit 201 may include: a plurality of second switch transistors T2 and a plurality of second resistors R2 connected in series. One terminals of the plurality of second resistors R2 connected in series may be connected to the second power supply terminal GND; and the other terminals of the plurality of second resistors R2 connected in series may be connected to the first power supply terminal VCC (not shown in FIG. 10) and the frequency generating unit 202.

A gate of each of the second switch transistors T2 may be connected to one output terminal of the signal generating sub-circuit 10, and the gates of the second switch transistors T2 are connected to different output terminals (not shown in FIG. 10). All the first electrodes of the plurality of second switch transistors T2 may be connected to the second power supply terminal GND. A second electrode of each of the second switch transistors T2 may be connected between two adjacent second resistors R2, and the second electrode of only one of the second switch transistors T2 may be connected between each two adjacent second resistors R2.

For the working principle of the electromagnetic interference suppression circuit shown in FIG. 10, a reference may be made to the working principle of the circuit structure shown in FIG. 9, which will not be repeated here. Moreover, it can be seen with reference to FIG. 9 and FIG. 10 that the frequency generating unit 202 may include: an oscillator.

Optionally, in the embodiment of the present disclosure, the quantity of parallel target sequence signals finally generated by the frequency generating sub-circuit 20 may be the same as the quantity of switch transistors included in the current providing unit 201 in the frequency generating sub-circuit 20. As such, the accuracy of controlling the switch transistor may be further improved, which may in turn improve the accuracy and efficiency of suppressing the EMI generated by the switch mode power supply.

In summary, the embodiments of the present disclosure provide the electromagnetic interference suppression circuit. The electromagnetic interference suppression circuit includes the signal generating sub-circuit and the frequency generating sub-circuit. Since the signal generating sub-circuit may generate the plurality of parallel target sequence signals, each with a period greater than a period threshold and a quantity of signals greater than a quantity threshold, the frequency generating sub-circuit may output a frequency-jittered drive signal, for driving the switch mode power supply to operate, to the switch mode power supply under the control of the plurality of parallel target sequence signals. Therefore, the electromagnetic interference generated by the switch mode power supply is suppressed effectively and reliably based on the frequency jittering technology, with reduced cost.

Figure 11:
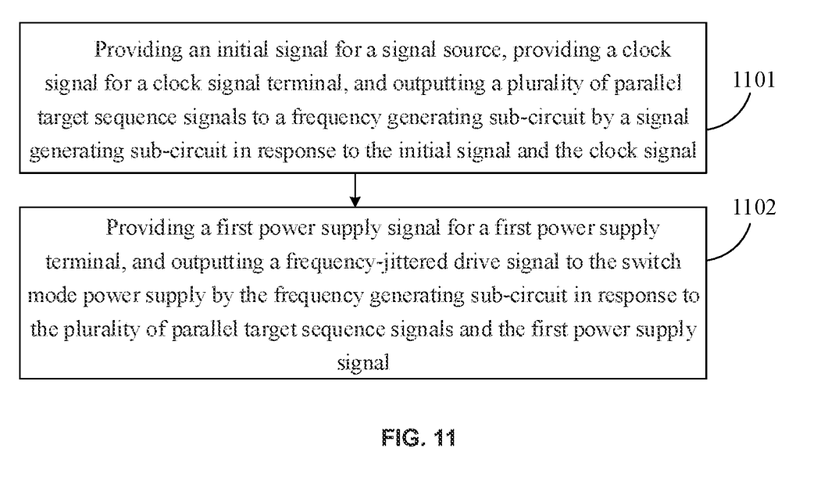
FIG. 11 is a flowchart of a method for driving an electromagnetic interference suppression circuit according to an embodiment of the present disclosure.

FIG. 11 is a flowchart of a method for driving an electromagnetic interference suppression circuit according to an embodiment of the present disclosure. The method may be applied in the electromagnetic interference suppression circuit according to the embodiments above. For example, it may be applied to the electromagnetic interference suppression circuit shown in any one of FIG. 2 to FIG. 10. As shown in FIG. 11, the method may include the following steps.

In step 1101, an initial signal is provided for a signal source; a clock signal is provided for a clock signal terminal; and a signal generating sub-circuit outputs a plurality of parallel target sequence signals to a frequency generating sub-circuit in response to the initial signal and the clock signal.

In an embodiment of the present disclosure, the period of each target sequence signal may be greater than the period threshold, and the quantity of parallel target sequence signals may be greater than the quantity threshold.

In step 1102, a first power supply signal is provided for a first power supply terminal; and the frequency generating sub-circuit outputs a frequency-jittered drive signal to the switch mode power supply in response to the plurality of parallel target sequence signals and the first power supply signal.

The drive signal may be configured to drive the switch mode power supply to operate.

In summary, the embodiments of the present disclosure provide the method for driving the electromagnetic interference suppression circuit. Since the signal generating sub-circuit may generate the plurality of parallel target sequence signals, each with a period greater than a period threshold and a quantity of signals greater than a quantity threshold, the frequency generating sub-circuit may output a frequency-jittered drive signal, for driving the switch mode power supply to operate, to the switch mode power supply under the control of the plurality of parallel target sequence signals. Therefore, the electromagnetic interference generated by the switch mode power supply is suppressed effectively and reliably based on the frequency jittering technology, with reduced cost.

With reference to FIG. 5 and FIG. 9, the working principle of the electromagnetic interference suppression circuit according to an embodiment of the present disclosure is introduced below with the current providing unit 2011 including a total of 15 first switch transistors T1 each of which is an N-type switch transistor, by way of example.

A clock signal is provided for the clock signal terminal CLK, an initial signal is provided for the signal source VO, and a first power supply signal is provided for the first power supply terminal VCC. The ten D flip-flops included in the first sequence generator 101 may operate under the control of the clock signal and the initial signal, and four parallel initial sequence signals are output to the 4-15 decoder 102 by the logic gates, with each initial sequence signal having a period of 1024.

The 4-15 decoder 102 may decode and convert the four parallel initial sequence signals into 15 parallel target sequence signals, and output these signals to the gates of the 15 first switch transistors T1 respectively by the output terminals Y1 to Y15; and the period of each target sequence signal is also 1024.

Each first switch transistor T1 may be turned on when the potential of the target sequence signal output to the gate thereof is a valid potential, and turned off when the potential of the target sequence signal output to the gate thereof is an invalid potential. The current mirror unit 2011 may output a drive current to the oscillator 202 in response to the first power supply signal based on a quantity of first transistors T1 that are finally turned on, that is, a quantity of first resistors R1 that are finally connected. The oscillator 202 may generate a frequency-jittered drive signal based on the drive current, and output the drive signal to the connected switch mode power supply, thereby suppressing the EMI generated by the switch mode power supply.

In summary, the embodiments of the present disclosure provide the method for driving the electromagnetic interference suppression circuit. Since the signal generating sub-circuit may generate the plurality of parallel target sequence signals, each with a period greater than a period threshold and a quantity of signals greater than a quantity threshold, the frequency generating sub-circuit may output a frequency-jittered drive signal, for driving the switch mode power supply to operate, to the switch mode power supply under the control of the plurality of parallel target sequence signals. Therefore, the electromagnetic interference generated by the switch mode power supply is suppressed effectively and reliably based on the frequency jittering technology, with reduced cost.

Figure 12:
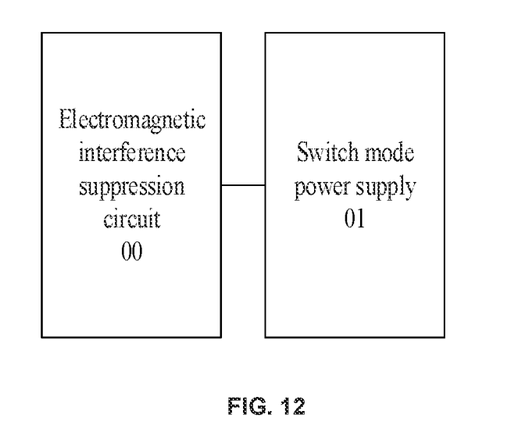
FIG. 12 is a schematic structural diagram of an electronic apparatus according to an embodiment of the present disclosure.

FIG. 12 is a schematic structural diagram of an electronic apparatus according to an embodiment of the present disclosure. As shown in FIG. 12, the electronic apparatus may include: a switch mode power supply 01, and an electromagnetic interference suppression circuit 00 according to the embodiments above. For example, the electromagnetic interference suppression circuit 00 is as shown in any one of FIG. 2 to FIG. 10.

The electromagnetic interference suppression circuit 00 may be connected to the switch mode power supply 01, and may output a frequency-jittered drive signal to the switch mode power supply 00; and the switching circuit 00 may operate in response to the drive signal.

Optionally, the electronic apparatus is a display device. The display device may be: an LCD display panel, a mobile phone, a tablet computer, a television, a digital photo frame, or any products or components that have a display function.

A person skilled in the art may clearly understand that for the convenience and brevity of the description, reference may be made to the corresponding processes in the method embodiments for the specific operating processes of the electromagnetic interference suppression circuit, circuits and units as described above, the details of which will not be repeated here.

Described above are merely optional embodiments of the present disclosure, which are not intended to limit the present disclosure. Any modifications, equivalent substitutions, improvements and the like made within the spirit and principle of the present disclosure shall fall within the protection scope of the present disclosure.

What is claimed is:

1. An electromagnetic interference suppression circuit, comprising: a signal generating sub-circuit and a frequency generating sub-circuit; wherein
the signal generating sub-circuit is connected to a signal source, a clock signal terminal, and the frequency generating sub-circuit respectively, and is configured to output a plurality of parallel target sequence signals to the frequency sub-circuit in response to an initial signal provided by the signal source and a clock signal provided by the clock signal terminal, each of the target sequence signals having a period greater than a period threshold, and a quantity of target sequence signals being greater than a quantity threshold; and
the frequency generating sub-circuit is connected to a first power supply terminal and further connected to a switch mode power supply, and is configured to output a frequency-jittered drive signal to the switch mode power supply in response to the plurality of parallel target sequence signals and a first power supply signal provided by the first power supply terminal, the drive signal being intended to drive the switch mode power supply to operate.

2. The electromagnetic interference suppression circuit according to claim 1, wherein the signal generating sub-circuit comprises: a first sequence generator and a decoder; wherein
the decoder comprises a plurality of input terminals and a plurality of output terminals, a quantity of input terminals of the decoder being less than the quantity threshold, and a quantity of output terminals of the decoder being greater than the quantity threshold;
the first sequence generator is connected to the signal source, the dock signal terminal, and the plurality of input terminals of the decoder respectively, and is configured to output a plurality of parallel initial sequence signals to the decoder by the plurality of input terminals of the decoder in response to the initial signal and the dock signal, each of the initial sequence signals has a period greater than the period threshold; and
the plurality of output terminals of the decoder are connected to the frequency generating sub-circuit, and the decoder is configured to output the plurality of parallel target sequence signals to the frequency generating sub-circuit in response to the plurality of parallel initial sequence signals.

3. The electromagnetic interference suppression circuit according to claim 2, wherein the first sequence generator comprises: a plurality of D flip-flops and a logic gate unit; wherein
clock signals interfaces of the plurality of D flip-flops are all connected to the clock signal terminal, and an input terminal of a first D flip-flop of the D flip-flops is connected to the signal source and an output terminal of the logic gate unit, an output terminal of each of the D flip-flops except the first D flip-flop is connected to an output terminal of a previous D flip-flop thereof, and the output terminal of each of the D flip-flops is connected to an input terminal of the logic gate unit; and
the output terminal of the logic gate unit is further connected to the plurality of input terminals of the decoder, and is configured to generate the plurality of parallel initial sequence signals based on signals output by the output terminals of the plurality of D flip-flops.

4. The electromagnetic interference suppression circuit according to claim 3, wherein the first sequence generator comprises ten D flip-flops; and the logic gate unit comprises; seven NOR gates, four NOT gates, one AND gate, one XOR gate, and one OR gate; wherein
the output terminal of the first D flip-flop and the output terminal of a second D flip-flop of the D flip-flops are connected to an input terminal of a first NOR gate, and the output terminals of a third D flip-flop to a sixth D flip-flop of the flip-flops are connected to an input terminal of a second NOR gate, output terminals of a seventh D flip-flop to a tenth D flip-flop of the D flip-flops are connected to an input terminal of a third NOR gate, and the output terminal of a seventh D flip-flop and the output terminal of a tenth D flip-flop are connected to an input terminal of the XOR gate;
an output terminal of the first NOR gate, an output terminal of the second NOR gate, and an output terminal of the third NOR gate are all connected to an input terminal of the AND gate, an output terminal of the AND gate or an output terminal of the XOR gate is connected to an input terminal of the OR gate, and an output terminal of the OR gate is connected to the input terminal of the first D flip-flop;
the output terminal of the first D flip-flop is further connected to an input terminal of a fourth NOR gate, the output terminal of the second D flip-flop is further connected to an input terminal of a fifth NOR gate, the output terminal of the third D flip-flop is further connected to an input terminal of a sixth NOR gate, the output terminal of the fourth D flip-flop is further connected to an input terminal of a seventh NOR gate, and the input terminals of the fourth NOR gate to the seventh NOR gate are further connected to the initial signal terminal; and
an input terminal of a first NOT gate is connected to the output terminal of the fourth NOR gate and the input terminal of the decoder, an input terminal of a second NOT gate is connected to the output terminal of the fifth NOR gate and the input terminal of the decoder, an input terminal of a third NOT gate is connected to the output terminal of the sixth NOR gate and the input terminal of the decoder, and an input terminal of a fourth NOT gate is connected to the output terminal of the seventh NOR gate and the input terminal of the decoder.

5. The electromagnetic interference suppression circuit according to claim 1, wherein the signal generating sub-circuit comprises: a second sequence generator; wherein
the second sequence generator comprises an input terminal and a plurality of output terminals, a quantity of output terminals of the second sequence generator being greater than the quantity threshold; and
the input terminal of the second sequence generator is connected to the signal source and the clock signal terminal respectively, the plurality of output terminals of the second sequence generator are connected to the frequency generating sub-circuit, and the second sequence generator is configured to generate the plurality of parallel target sequence signals in response to the initial signal and the clock signal, and to output the plurality of parallel target sequence signals to the frequency generating sub-circuit by the plurality of output terminals of the second sequence generator.

6. The electromagnetic interference suppression circuit according to claim 1, wherein the frequency generating sub-circuit comprises: a current providing unit and a frequency generating unit; wherein
the current providing unit is connected to the first power supply terminal, the signal generating sub-circuit, and the frequency generating unit respectively, and is configured to output a drive current to the frequency generating unit in response to the plurality of parallel target sequence signals and the first power supply signal; and
the frequency generating unit is further connected to the switch mode power supply, and is configured to generate the frequency-jittered drive signal under the driving of the drive current and output the frequency-jittered drive signal to the switch mode power supply.

7. The electromagnetic interference suppression circuit according to claim 6, wherein the current providing unit is further connected to a reference power supply terminal, and is configured to output the drive current to the frequency generating unit based on the reference power supply signal provided by the reference power supply terminal and a partial voltage of the current providing unit.

8. The electromagnetic interference suppression circuit according to claim 7, wherein the current providing unit comprises: a plurality of first switch transistors, a plurality of first resistors connected in series, and a current mirror unit; wherein
one terminals of the plurality of first resistors connected in series are connected to a second power supply terminal, the other terminals of the plurality of first resistors connected in series are connected to the current mirror unit, and the current mirror unit is further connected to the first power supply terminal, the reference power supply terminal, and the frequency generating unit respectively;
a gate of each of the first switch transistors is connected to one output terminal of the signal generating sub-circuit, and the gates of the first switch transistors are connected to different output terminals;
first electrodes of the plurality of first switch transistors are all connected to the second power supply terminal; and
a second electrode of each of the first switch transistors is connected between two adjacent first resistors, and the second electrode of only one of the first switch transistors is connected between each two adjacent first resistors.

9. The electromagnetic interference suppression circuit according to claim 8, wherein the current mirror unit comprises: a first transistor, a second transistor, a third transistor and a comparator; wherein
a first input terminal of the comparator is connected to the reference power supply terminal, a second input terminal of the comparator is connected to the other terminal of the plurality of first resistors connected in series, and an output terminal of the comparator is connected to a gate of the first transistor;
a first electrode of the first transistor is connected to the other terminal of the plurality of first resistors connected in series, and a second electrode of the first transistor is connected to a first electrode of the second transistor; and
a gate of the second transistor is connected to a gate of the third transistor, a second electrode of the second transistor and a first electrode of the third transistor are connected to the first power supply terminal, and a second electrode of the third transistor is connected to the frequency generating unit.

10. The electromagnetic interference suppression circuit according to claim 6, wherein the current providing unit comprises: a plurality of second switch transistors and a plurality of second resistors connected in series; wherein
one terminals of the plurality of second resistors connected in series are connected to a second power source terminal, and the other terminals of the plurality of second resistors connected in series are connected to the first power supply terminal and the frequency generating unit;
a gate of each of the second switch transistors is connected to one output terminal of the signal generating sub-circuit, and the gates of the second switch transistors are connected to different output terminals;
first electrodes of the plurality of second switch transistors are all connected to the second power supply terminal; and
a second electrode of each of the second switch transistors is connected between two adjacent second resistors, and the second electrode of only one of the second switch transistors is connected between each two adjacent second resistors.

11. The electromagnetic interference suppression circuit according to claim 6, wherein the frequency generating unit comprises an oscillator.

12. The electromagnetic interference suppression circuit according to claim 4, wherein the frequency generating sub-circuit comprises: a current providing unit and a frequency generating unit; wherein
the frequency generating unit comprises an oscillator;
the current providing unit is connected to a reference power supply terminal, the first power supply terminal, the signal generating sub-circuit, and the frequency generating unit respectively, and is configured to output a drive current to the frequency generating unit in response to the plurality of parallel target sequence signals, the first power supply signal, a reference power supply signal provided by the reference power supply terminal, and a partial voltage of the current providing unit;
the frequency generating unit is further connected the switch mode power supply, and is further configured to generate the frequency-jittered drive signal under the driving of the drive current, and output the frequency-jittered drive signal to the switch mode power supply,
wherein the current providing unit comprises: a plurality of first switch transistors, a plurality of first resistors connected in series, and a current mirror unit;
wherein the current mirror unit comprises: a first transistor, a second transistor, a third transistor and a comparator; one terminals of the plurality of first resistors connected in series are connected to a second power supply terminal, the other terminals of the plurality of first resistors connected in series are connected to the current mirror unit, and the current mirror unit is further connected to the first power supply terminal, the reference power supply terminal, and the frequency generating unit respectively;

wherein a gate of each of the first switch transistors is connected to one output terminal of the signal generating sub-circuit, and the gates of the first switch transistors are connected to different output terminals; first electrodes of the plurality of first switch transistors are all connected to the second power supply terminal; a second electrode of each of the first switch transistors is connected between two adjacent first resistors, and the second electrode of only one of the first switch transistors is connected between each two adjacent first resistors; a first input terminal of the comparator is connected to the reference power supply terminal, a second input terminal of the comparator is connected to the other terminals of the plurality of first resistors connected in series, and an output terminal of the comparator is connected to a gate of the first transistor; a first electrode of the first transistor is connected to the other terminals of the plurality of first resistors connected in series, and a second electrode of the first transistor is connected to a first electrode of the second transistor; a gate of the second transistor is connected to a gate of the third transistor, a second electrode of the second transistor and a first electrode of the third transistor are connected to the first power supply terminal, and a second electrode of the third transistor is connected to the frequency generating unit; or the current providing unit comprises: a plurality of second switch transistors and a plurality of second resistors connected in series;
wherein one terminals of the plurality of second resistors connected in series being connected to a second power supply terminal, the other terminals of the plurality of second resistors connected in series being connected to the first power supply terminal and the frequency generating unit, wherein a gate of each of the second switch transistors is connected to one output terminal of the signal generating sub-circuit, and the gates of the second switch transistors are connected to different output terminals; first electrodes of the plurality of second switch transistors are all connected to the second power supply terminal; and a second electrode of each of the second switch transistors is connected between two adjacent second resistors, and the second electrode of only one of the second switch transistors is connected between each two adjacent second resistors.

13. The electromagnetic interference suppression circuit according to claim 5, wherein the frequency generating sub-circuit comprises: a current providing unit and a frequency generating unit, and the frequency generating unit is an oscillator;
the current providing unit is connected to a reference power supply terminal, the first power supply terminal, the signal generating sub-circuit, and the frequency generating unit respectively, and is configured to output a drive current to the frequency generating unit in response to the plurality of parallel target sequence signals, the first power supply signal, a reference power supply signal provided by the reference power supply terminal, and a partial voltage of the current providing unit;
the frequency generating unit is further connected to the switch mode power supply, and is configured to generate the frequency-jittered drive signal under the driving of the drive current, and output the frequency-jittered drive signal to the switch mode power supply;
the current providing unit comprises: a plurality of first switch transistors, a plurality of first resistors connected in series, and a current mirror unit;
wherein the current mirror unit comprises a first transistor, a second transistor, a third transistor, and a comparator; one terminals of the plurality of first resistors connected in series are connected to a second power supply terminal, the other terminals of the plurality of first resistors connected in series are connected to the current mirror unit, and the current mirror unit is further connected to the first power supply terminal, the reference power supply terminal, and the frequency generating unit respectively;
wherein a gate of each of the first switch transistors is connected to one output terminal of the signal generating sub-circuit, and the gates of the first switch transistors are connected to different output terminals; first electrodes of the plurality of first switch transistors are all connected to the second power supply terminal; a second electrode of each of the first switch transistors is connected between two adjacent first resistors, and the second electrode of only one of the first switch transistors is connected between each two adjacent first resistors; a first input terminal of the comparator is connected to the reference power supply terminal, a second input terminal of the comparator is connected to the other terminal of the plurality of first resistors connected in series, and an output terminal of the comparator is connected to a gate of the first transistor; a first electrode of the first transistor is connected to the other terminal of the plurality of first resistors connected in series, and a second electrode of the first transistor is connected to a first electrode of the second transistor; a gate of the second transistor is connected to a gate of the third transistor, a second electrode of the second transistor and a first electrode of the third transistor are connected to the first power supply terminal, and a second electrode of the third transistor is connected to the frequency generating unit; or the current providing unit comprises: a plurality of second switch transistors and a plurality of second resistors connected in series;
wherein one terminals of the plurality of second resistors connected in series are connected to a second power supply terminal, the other terminals of the plurality of second resistors connected in series are connected gate the first power supply terminal and the frequency generating unit, a gate of each of the second switch transistors is connected to one output terminal of the signal generating sub-circuit, and the gates of the second switch transistors are connected to different output terminals; first electrodes of the plurality of second switch transistors are all connected to the second power supply terminal; and a second electrode of each of the second switch transistors is connected between two adjacent second resistors, and the second electrode of only one of the second switch transistors is connected between each two adjacent second resistors.

14. A method for driving an electromagnetic interference suppression circuit, the electromagnetic interference suppression circuit comprising: a signal generating sub-circuit and a frequency generating sub-circuit, wherein the signal generating sub-circuit is connected to a signal source, a clock signal terminal, and the frequency generating sub-circuit respectively, and the frequency generating sub-circuit is further connected to the first power supply terminal, and is configured to connect a switch mode power supply;

the method comprising:
providing an initial signal for the signal source, providing a clock signal for the clock signal terminal, and outputting a plurality of parallel target sequence signals to the frequency generating sub-circuit by the signal generating sub-circuit in response to the initial signal and the clock signal, wherein each of the target sequence signals has a period greater than a period threshold, and a quantity of parallel target sequence signals is greater than a quantity threshold; and providing a first power supply signal for the first power supply terminal, and outputting a frequency-jittered drive signal to the switch mode power supply by the frequency generating sub-circuit in response to the plurality of parallel target sequence signals and the first power supply signal, wherein the drive signal is configured to drive the switch mode power supply to operate.

15. The method according to claim 14, wherein
the signal generating sub-circuit comprises: a first sequence generator and a decoder comprising a plurality of input terminals and a plurality of output terminals, a quantity of input terminals of the decoder being less than the quantity threshold, and a quantity of output terminals of the decoder being greater than the quantity threshold; and
outputting the plurality of parallel target sequence signals to the frequency generating sub-circuit by the signal generating sub-circuit in response to the initial signal and the clock signal comprises;
outputting a plurality of parallel initial sequence signals to the decoder by the plurality of input terminals of the decoder by the first sequence generator in response to the initial signal and the clock signal, wherein each of the initial sequence signals has a period greater than the period threshold; and
outputting the plurality of parallel target sequence signals to the frequency generating sub-circuit by the decoder in response to the plurality of parallel initial sequence signals.

16. The method according to claim 14, wherein
the signal generating sub-circuit comprises; a second sequence generator comprising an input terminal and a plurality of output terminals, a quantity of output terminals of the second sequence generator being greater than the quantity threshold; and
outputting the plurality of parallel target sequence signals to the frequency generating sub-circuit by the signal generating sub-circuit in response to the initial signal and the clock signal comprises:
generating a plurality of parallel target sequence signals in response to the initial signal and the dock signal and outputting the plurality of parallel target sequence signals to the frequency generating sub-circuit by the plurality of output terminals of the second sequence generator, by the second sequence generator.

17. The method according to claim 14, wherein
the frequency generating sub-circuit comprises: a current providing unit and a frequency generating unit; and
outputting the frequency-jittered drive signal to the switch mode power supply by the frequency generating sub-circuit in response to the plurality of parallel target sequence signals and the first power supply signal comprises:
outputting a drive current to the frequency generating unit by the current providing unit in response to the plurality of parallel target sequence signals and the first power supply signal; and
generating a frequency-jittered drive signal under the driving of the drive current and outputting the drive signal to the switch mode power supply, by the frequency generating unit.

18. The method according to claim 17, wherein
the current providing unit is further connected to a reference power supply terminal; and
outputting the drive current to the frequency generating unit by the current providing unit in response to the plurality of parallel target sequence signals and the first power supply signal comprises:
outputting the drive current to the frequency generating unit by the current providing unit in response to the multiple parallel target sequence signals, the first power supply signal, a reference power supply signal provided by the reference power supply terminal, and a partial voltage of the current providing unit.

19. An electronic apparatus, comprising: a switch mode power supply, and an electromagnetic interference suppression circuit, the electromagnetic interference suppression circuit comprising: a signal generating sub-circuit and a frequency generating sub-circuit; wherein
the signal generating sub-circuit is connected to a signal source, a clock signal terminal and the frequency generating sub-circuit respectively, and the signal generating sub-circuit is configured to output a plurality of parallel target sequence signals to the frequency sub-circuit in response to an initial signal provided by the signal source and a clock signal provided by the clock signal terminal, each target sequence signal having a period greater than a period threshold, and a quantity of target sequence signals being greater than a quantity threshold;
the frequency generating sub-circuit is further connected to a first power supply terminal and the switch mode power supply respectively, and is configured to output a frequency-jittered drive signal to the switch mode power supply in response to the plurality of parallel target sequence signals and a first power supply signal provided by the first power supply terminal; and
the switch mode power supply operates under the control of the drive signal.

20. The electronic apparatus according to claim 19, wherein the electronic apparatus comprises a display device.

* * * * *

UNITED STATES PATENT AND TRADEMARK OFFICE
CERTIFICATE OF CORRECTION

| | |
|---|---|
| PATENT NO. | : 11,398,174 B2 |
| APPLICATION NO. | : 16/999119 |
| DATED | : July 26, 2022 |
| INVENTOR(S) | : Xiaoshi Liu et al. |

It is certified that error appears in the above-identified patent and that said Letters Patent is hereby corrected as shown below:

On the Title Page

Item (73) should read as follows:
(73) Assignees: Hefei Xinsheng Optoelectronics Technology Co., LTD, Anhui (CN); BOE Technology Group Co., LTD, Beijing (CN)

Signed and Sealed this
Twentieth Day of September, 2022

Katherine Kelly Vidal
*Director of the United States Patent and Trademark Office*